(12) United States Patent
Nakagawa et al.

(10) Patent No.: US 6,312,857 B1
(45) Date of Patent: Nov. 6, 2001

(54) PHOTOMASK MATERIAL AND METHOD OF PROCESSING THEREOF

(75) Inventors: Kunihiro Nakagawa; Noriyuki Kawai; Masato Higashiyama; Tosihiko Netsuko; Yoshihiro Kagawa, all of Tokyo (JP)

(73) Assignee: Mitsubishi Paper Mills Ltd., Tokyo (JP)

( * ) Notice: Subject to any disclaimer, the term of this patent is extended or adjusted under 35 U.S.C. 154(b) by 0 days.

(21) Appl. No.: 09/559,254

(22) Filed: Apr. 27, 2000

(30) Foreign Application Priority Data

| Apr. 17, 1999 | (JP) | 11-119052 |
| Apr. 27, 1999 | (JP) | 11-119050 |
| Apr. 27, 1999 | (JP) | 11-119051 |
| Apr. 27, 1999 | (JP) | 11-119053 |
| Apr. 28, 1999 | (JP) | 11-122310 |
| May 28, 1999 | (JP) | 11-148982 |
| Jul. 13, 1999 | (JP) | 11-198275 |
| Nov. 30, 1999 | (JP) | 11-340439 |

(51) Int. Cl.$^7$ ..................................................... G03F 9/00
(52) U.S. Cl. ........................................................... 430/5
(58) Field of Search ............................. 430/5, 270.1, 302, 430/308, 396, 233, 234

(56) References Cited

FOREIGN PATENT DOCUMENTS

| 50-65232 | 6/1975 | (JP) . |
| 53-21602 | 2/1978 | (JP) . |
| 1-158426 | 6/1989 | (JP) . |
| 4-340539 | 11/1992 | (JP) . |
| 6-273867 | 9/1994 | (JP) . |
| 8-110641 | 4/1996 | (JP) . |
| 2000-10258 | 1/2000 | (JP) . |

*Primary Examiner*—S. Rosasco
(74) *Attorney, Agent, or Firm*—Nixon & Vanderhye

(57) ABSTRACT

A photomask material which has high-definition image reproducibility and gives a photomask having good image strength, heat resistance and durability against light (ultraviolet light) and which is for use to form a circuit pattern etc., and a method of effectively processing the above photomask material.

The photomask material comprises has at least a silver halide emulsion layer and a physical development center layer on a glass substrate, the physical development center layer being formed between the glass substrate and the silver halide emulsion layer, and gives a photomask having a metal silver image having a thickness of 1 µm or less formed on the glass substrate and having a maximum optical density of at least 1.0, and the method comprises the processing steps at least of development, fixing with a fixing solution and washing with water, the fixing solution containing a proteolytic enzyme and a phosphoric acid salt, having a pH of at least 5 and being maintained at a constant temperature of at least 30° C., the silver halide emulsion being removed with the fixing solution in the fixing step.

28 Claims, No Drawings

PHOTOMASK MATERIAL AND METHOD OF PROCESSING THEREOF

BACKGROUND OF THE INVENTION

1. Field of the Invention

The present invention relates to a photomask material and a method of processing it. More specifically, the present invention relates to a photomask material which has high-definition image reproducibility and gives a photomask having good image strength, heat resistance and durability against light (ultraviolet light) and which is for use to form a circuit pattern, etc., and a method of effectively processing the above photomask material.

2. Related Art Statement

In recent years, with finer patterns of printed wiring boards, the substrate of a photomask for producing printed wiring boards is shifting from a film to a glass. Further, a photomask for producing a liquid crystal display or LSI is required to use a glass as a substrate due to requirements of high accuracy.

As a photomask material using a glass as a substrate, a so-called dry plate having a substrate and a silver halide emulsion layer formed thereon (to be referred to as "emulsion mask" hereinafter) is less expensive and simple. When the silver halide photographic photosensitive layer of an emulsion mask is exposed to light, an exposed silver halide forms a black image by development. An emulsion mask to which silver salt photography is applied is easily highly sensitized for use with a laser light source, and the system thereof is simple. Since, however, black-coloring silver is dispersed in a layer having a relatively large thickness of 2 to 6 $\mu$m, the above emulsion mask is poor in reproduction of a fine image due to the thickness of the image even if a photographic processing for increasing a contrast is carried out, so that it is not suitable for an image having a size of 10 $\mu$m or less.

As another photomask material using a glass as a substrate, a photomask material for constituting an image of a hard metal thin layer (to be referred to as "hard mask" hereinafter) is available. The light shielding layer of a hard mask is a metal thin layer, and the mainstream thereof is a chromium layer having a thickness of approximately 0.1 $\mu$m. The hard mask is therefore excellent in reproduction of a fine image having a size of approximately 1 $\mu$m. However, the steps of etching, etc., are complicated, and no photomask can be easily obtained from the hard mask at present, so that the problem is that the photomask is expensive. Moreover, the hard mask is still insufficient in sharpness and stability in the steps of forming a resist layer of a highly sensitive photopolymer and exposing, and it is not feasible for exposing a fine image directly with a laser light source. Further, chromium involves an environmental problem, and it is forced to employ other methods in recent years.

In JP-A-12-10258, the present inventors have proposed a photomask material (to be referred to as "DTR mask" hereinafter) which gives a photomask having a silver image directly formed on a transparent substrate by a diffusion transfer method. A photomask obtained from the DTR mask is free from discoloration and alteration under heat or ultraviolet light in the continuous use thereof as a photomask since it contains no gelatin, and further, the DTR mask gives a photomask having an image constituted of a metal thin layer by relatively simple processing. It can be therefore easily assumed that the DTR mask has a potential for meeting with the formation of finer patterns hereafter. For being equal or superior to existing photomask materials such as an emulsion mask and a hard mask, however, the DTR mask is required to have the capability of reproduction of a higher-definition image, high image strength, high heat resistance, high durability against light (ultraviolet light), and the like. The capability of reproduction of a high-definition image reproduction includes various factors such as the capability of reproducing a shape and size (line width, etc.), a sharpness of edges and a presence or absence of black spots in a non-image area. No prior art has complied thereto, and it has been and is expected to develop novel techniques. Concerning the image strength, the problem is that metal silver constituting an image on a DTR mask has poor image strength as compared with a chromium image of a chromium mask, so that the image is liable to be damaged when the exposure of a photomask obtained from the DTR mask to light is repeated a number of times while being in contact with photosensitive materials.

DISCLOSURE OF THE INVENTION

Under the circumstances, a first object of the present invention is to provide a photomask material which has reproducibility of a high-definition image and achieves an excellent image strength, heat resistance and durability against light (ultraviolet light) and which is for use to form a circuit pattern, etc.

A second object of the present invention is to provide a method of effectively processing the above photomask material.

The present inventors have made diligent studies for achieving the above objects and have found that the above first object can be achieved by a photomask material comprising a glass substrate and a silver halide emulsion layer formed on the glass substrate, and further comprising a physical development center layer between the glass substrate and the silver halide emulsion layer, which gives a metal silver image having a thickness of a certain value or less on the glass substrate by physical development, the metal silver image having a maximum optical density of a certain value or more.

Further, it has been found that the second object of the present invention can be achieved by a method of processing the above photomask material, which comprises the steps of development, fixing and washing with water, wherein, in the fixing step, the silver halide emulsion is removed with a specific fixing solution under specific conditions.

The present invention has been completed on the basis of the above findings.

That is, the first object of the present invention is achieved by a photomask material having at least a silver halide emulsion layer and a physical development center layer on a glass substrate, the physical development center layer being formed between the glass substrate and the silver halide emulsion layer, the photomask material being for giving a metal silver image having a thickness of 1 $\mu$m or less formed on the glass substrate by physical development, the metal silver image having a maximum optical density of 1.0 or more.

Further, the second object of the present invention is achieved by a method of processing the above photomask material, comprising the processing steps of at least development, fixing with a fixing solution and washing with water, the fixing solution containing a proteolytic enzyme and a phosphoric acid salt, having a pH of at least 5 and being maintained at a constant temperature of at least 30° C., the silver halide emulsion being removed with the fixing solution in the fixing step.

PREFERRED EMBODIMENTS OF THE INVENTION

In the photomask material and the method of processing the photomask, provided by the present invention, a silver layer is formed on a glass substrate according to the principle of a silver complex salt diffusion transfer reversal process (to be referred to as "DTR process" hereinafter), and the silver layer is used as an image. In the DTR process, a non-exposed silver halide is dissolved to be converted to a soluble silver complex compound, and the soluble silver complex compound diffuses through the silver halide emulsion layer and is developed in a site where the physical development center is present, to form a silver layer. On the other hand, in a silver halide in an exposed area, a latent image center is formed by irradiation with light and chemically developed in the emulsion layer. When the thus-obtained material is washed with hot water, or the like, a silver halide photographic photosensitive layer containing a water-soluble gelatin as a main binder is removed, only the silver layer formed on the physical development center in the non-exposed area is retained on the glass substrate, to form an image. In this manner, there can be obtained a metal silver thin layer containing no water-soluble gelatin and having a thickness of 1 $\mu$m or less, preferably 0.5 $\mu$m or less, and the present inventors have found that the thus-obtained thin layer can be used as a photomask for printing an electronic circuit pattern.

JP-A-50-65232 and JP-A-6-273867 disclose methods in which a thin mask layer made of a metal or a metal oxide is formed in a glass substrate or on a glass substrate directly or through a thin undercoat layer. In these methods, however, a photosensitive material having a silver halide emulsion layer on a glass substrate, i.e., a photosensitive material having an emulsion mask constitution or a photosensitive material having a mask layer interposed between a glass substrate and a silver halide emulsion layer is exposed to light through an image, followed by a complicated step of etching, heating or voltage application, to form an image. The above methods are therefore constitutionally completely different from the present invention, and cannot be said to be a simple method for producing a photomask.

In the present invention, the glass substrate can be properly selected from known glass substrates in the field of this art depending upon a use or desired characteristics. Examples of the glass substrate include soda-lime glass substrates such as soda lime and white crown substrates, low-expansive glass substrates such as borosilicate glass, alkali-free glass and aluminosilicate glass substrates, and a synthetic quartz glass substrate.

The physical development center of the physical development center layer used in the present invention can be selected from known materials that are generally used in the silver complex salt diffusion transfer reversal method. For example, it can be selected from a metal colloid of gold, silver, or the like or a metal sulfide prepared by mixing a water-soluble salt of silver,. palladium, zinc or the like with a sulfide. As a protective colloid, a variety of water-base colloids including a low-molecular-weight gelatin may be also used. For details and production methods thereof, see JP-A-53-21602 or "Photographic Silver Halide Diffusion Process" written by Andre Rod and Edis Wyde issued by Focal Press, London, New York, 1972. As a coating auxiliary, a surfactant may be incorporated.

In preferred embodiments of the present invention, the physical development center distributes in a range of 0.1 $\mu$m in the thickness direction. The surface of the glass substrate is not always flat. Further, the thickness of the physical development center layer is not always constant due to variability in the step of application or particulate matter contained in a photomask material. The thickness of the physical development center layer refers to an average of thickness values obtained in measurement in at least 10 points. The thickness of the physical development center layer can be most easily obtained by calculating it on the basis of the weight, the specific gravity and the solid content of a physical development center layer coating solution. For attaining a distribution of the physical development center in a range of 0.1 $\mu$m in the thickness direction, preferably, no protective colloid is added, or the amount of the protective colloid is limited to the smallest amount in which no physical development center is sedimented.

In the present invention, the silver halide emulsion includes silver chloride, silver bromochloride, silver iodochloride and silver bromoiodocholoride. In a preferred embodiment of the present invention, the silver halide emulsion is an emulsion having a silver bromide content of 3 mol % to 40 mol % and contains silver bromochloride and silver bromoiodochloride. In a more preferred embodiment, the silver halide emulsion contains 0.1 mol % to 1 mol % of silver iodide. In a still more preferred embodiment, at least 90% of the above silver iodide is present in a region which represents 5% or less, more preferably 1% or less in terms of a molecular weight from the surface of each silver halide particle.

The crystal habit of the silver halide crystal may be any one of a cubic structure, an octahedral structure, cubo-octahedral structure, and a tarbular structure. The cubic structure is preferred. The silver halide may have a core-shell structure. The silver halide emulsion in the present invention may be chemically sensitized, such as reduction sensitization, sulfur sensitization, gold sensitization or sulfur+gold sensitization, to obtain a far higher sensitivity.

While the silver halide emulsion can be prepared by any method known in the field of this art, a double jet method is most preferred as a method of efficiently preparing the silver halide having the composition specified in the present invention. In the double jet method, a silver halide emulsion is prepared by pouring a solution containing silver ion and a solution containing halide ion into a gelatin solution with controlling their amounts, to grow silver halide particles. The composition of the silver halide can be easily changed by changing the kinds and amount ratios of halogens in the solution containing halide ion. The method of allowing at least 90% of contained silver iodide to be present in a range of 5% or less in terms of a molecular weight from the surface of each silver halide particle is most easily carried out by a method in which the step of preparing an emulsion by the double jet method is finished by 90% in terms of a molecular weight and then the solution containing halogen ion is replaced with a solution containing halogen ion in which iodine ion is included in a required amount. The method of allowing at least 90% of contained silver iodide to be present on the surface of each silver halide particle, i.e., in a range of 1% in terms of a molecular weight from the surface is most easily carried out by a method in which a silver halide emulsion is prepared and then a solution containing iodide ion, such as a potassium iodide aqueous solution is added to the emulsion to convert each silver halide particle surface to silver iodide. Otherwise, the silver halide emulsion can be prepared by a combination of the above methods.

In a preferred embodiment of the present invention, the silver halide emulsion is prepared in the presence of a water-soluble iridium salt, a water-soluble rhodium salt or both.

The water-soluble iridium salt used in the present invention includes iridium chloride, ammonium hexachloroiridate and potassium hexachloroiridate. The content of the above water-soluble iridium compound per mole of the silver halide is preferably at least $5.0 \times 10^{-8}$ mol, more preferably $1 \times 10^{-7}$ to $1 \times 10^{-5}$ mol. While the water-soluble iridium salt may be added at any time during the step of preparation of the silver halide emulsion, it is preferably added during the formation of silver halide particles.

The water-soluble rhodium salt used in the present invention includes rhodium monochloride, rhodium dichloride, rhodium trichloride and ammonium hexachlororhodate. Preferred is a trivalent rhodium compound. The amount of the above water-soluble rhodium compound per mole of the silver halide is preferably at least $5.0 \times 10^{-9}$ mol, more preferably $2 \times 10^{-8}$ to $1 \times 10^{-6}$ mol. While the water-soluble rhodium salt may be added at any time during the step of preparation of the silver halide emulsion, it is preferably added during the formation of silver halide particles.

For suiting the silver halide emulsion to every light source known in the field of this art, the silver halide emulsion of the present invention can be spectrally sensitized with sensitizing dyes used in general silver halide photographic emulsions. The sensitizing dye is required to be selected depending upon the wavelength and the intensity of a light source and the kind of a compound added. The sensitizing dye includes a cyanine dye, a merocyanine dye, a rhodacyanine dye, an oxonol dye, a styryl dye and a base styryl dye. Examples of the sensitizing dyes are as follows.

(a-1)
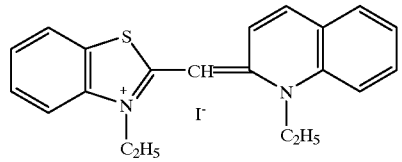

(a-2)
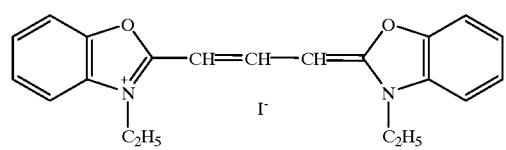

(a-3)
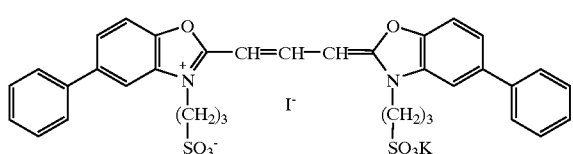

(a-4)
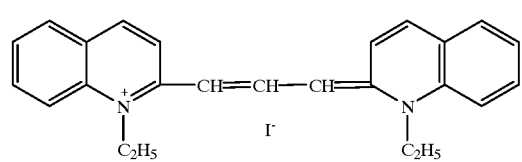

(a-5)
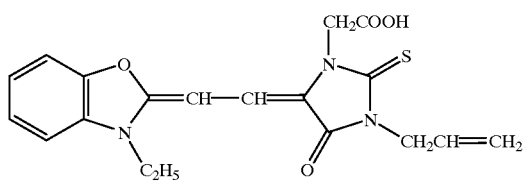

(a-6)
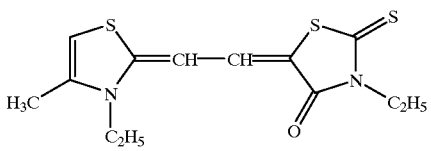

(a-7)
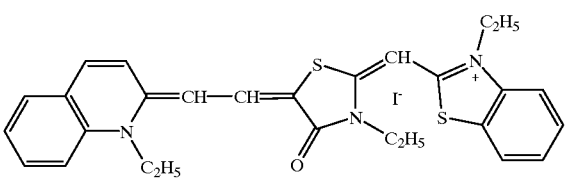

(a-8)
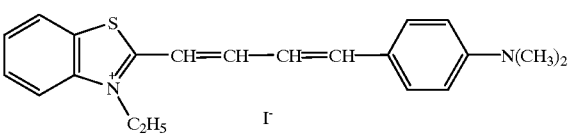

These sensitizing dyes may be used alone or in combination. While the amount of the sensitizing dye differs depending upon the characteristics of the silver halide emulsion and the intensity of a light source used and is not uniformly determined, the above amount per mole of the silver halide is preferably at least $5 \times 10^{-8}$ mole, particularly preferably $1 \times 10^{-7}$ to $1 \times 10^{-5}$ mole. The sensitizing dye may be added at any time before the silver halide emulsion is applied.

Further, the silver halide emulsion may contain any one of the following additives known in the field of this art. Examples of the additives include surfactants such as anionic, cationic, betaine and nonionic surfactants, thickeners such as carboxymethyl cellulose, application auxiliaries such as a defoamer, chelating agents such as ethylenediamine tetra acetate, and developing agents such as hydroquinone, polyhydroxybenzenes and 3-pyrazolidinone. Further, stabilizers such as azaindens and a heterocyclic mercapto compound and an antifoggant may be also incorporated.

As a binder for forming a silver halide emulsion layer in the present invention, a water-soluble gelatin may be used alone, or a water-soluble gelatin may be used in combination with casein, dextrin, gum arabic, polyvinyl alcohol or starch. The above water-soluble gelatin can be selected from acid-treated gelatin, alkali-treated gelatin, a gelatin derivative or grafted gelatin. In the present invention, the silver halide emulsion layer may be hardened by incorporating a hardener known in the field of this art. Preferably, however, the removal with warm water after development is easier when no hardener is substantially added.

In a preferred embodiment of the present invention, the silver halide emulsion layer, a layer underlying it or both contains a low-molecular-weight gelatin having an average molecular weight of approximately 50,000 or less. The low-molecular-weight gelatin is disclosed, for example, in JP-A-1-158426, JP-A-4-340539 and JP-A-8-110641. The low-molecular-weight gelatin used in the present invention can be prepared by the method disclosed in the above Japanese Laid-open Patent Publications, preferably, e.g., by decomposition with enzyme. The average molecular weight of the gelatin is approximately 50,000 or less, preferably approximately 20,000 or less, particularly preferably in the range of from approximately 3,000 to approximately 20,000. The low-molecular-weight gelatin may be contained in one layer alone, or it may be contained in a plurality of layers. While the amount of the low-molecular-weight gelatin in the present invention differs depending upon its molecular weight and the kind of a binder added, the above amount based on the binder amount can be in the broad range of from a very small amount of approximately 1% by weight to 100% by weight. In a preferred embodiment of the present invention, the above low-molecular-weight gelatin is incorporated into the silver halide emulsion layer. When it is incorporated into the silver halide emulsion layer, the amount thereof based on the binder for constituting the silver halide emulsion layer is 1 to 50% by weight, preferably 2 to 30% by weight.

The present inventors have found the following. That area of the silver halide emulsion which is present near a physical development center, i.e., that silver halide emulsion which is present in the vicinity of the glass substrate greatly works when a silver image is formed on the physical development center present on the glass substrate surface by diffusion transfer reversal. In a preferred embodiment of the present invention, therefore, the silver halide emulsion layer contains at least $1 \times 10^{-2}$ mol/m$^2$ of silver halide particles, and the silver halide emulsion layer preferably has a thickness, measured from the glass substrate surface, of 2 μm or less, particularly preferably 1 μm or less, per $1 \times 10^{-2}$ mol/m$^2$ of the silver halide particles. The glass substrate surface is not always flat, and the step of applying the silver halide emulsion varies or the photomask material contains particulate substance, so that the thickness of the silver halide emulsion layer is not necessarily constant. Therefore, the thickness of the silver halide emulsion layer in the present invention is an average value of measurement values in at least 10 points. The silver halide emulsion layer can be measured for a thickness by any method known in the field of this art. Typically, it can be measured by a method in which a glass mask material burred in a resin is sliced with a diamond cutter and a cross section is observed through an electron microscope.

In the present invention, the metal silver image has a thickness of 1 μm or less, and the metal silver image has a maximum optical density of at least 1.0. In a preferred embodiment of the present invention, the metal silver image has a thickness of 0.5 μm or less. As described above, the glass substrate surface is not always flat, and the step of applying the silver halide emulsion varies or the photomask material contains particulate substance, so that the thickness of the metal silver layer is not necessarily constant. Therefore, the thickness of the metal silver layer refers to an average thickness value in a square size of 10 mm×10 mm or large. Further, the optical density of the metal silver image differs depending upon the kind of an image. For example, the image is a very fine image, the optical density of such a very fine image can be half of the optical density of a large-area area (so-called solid area) or smaller. In the present invention, therefore, the maximum optical density refers similarly to a maximum density in a central area of a metal silver image having a square size of 10 mm×10 mm or larger.

In the present invention, the metal silver image and a non-image area on the glass substrate substantially do not contain the water-soluble gelatin. The above term "substantially do not contain" means that the thickness of the gelatin layer is sufficiently thin as compared with the thickness of the silver image, and specifically means that the content of the residual water-soluble gelatin is 0.01 g/m$^2$ or less.

A hydrophilic colloid layer on the opposite side of the silver halide emulsion layer of the present invention and the silver halide emulsion layer contain a dye and a pigment. The dye and the pigment can be selected form those known in the field of this art. Those dyes and pigments may be used alone or in combination. The terms "dye" and "pigment" vary in definition from one industrial field to another, and there is found no general criterion that clearly distinguishes these two terms. In the present invention, for an easier understanding, a "dye" refers to a colorant which is uniformly dissolved in water, and a "pigment" refers to a colorant which is hardly dissolved in water but forms particles in water. For improving the solubility of the dye in water, preferably, the dye has a molecule containing a plurality of soluble groups such as sulfonic acid groups or carboxylic acid groups.

In the present invention, the dye can be selected from a variety of dyes, but is required to be selected depending upon the spectral sensitivity wavelength of the silver halide emulsion. Typical examples of the dyes are as follows.

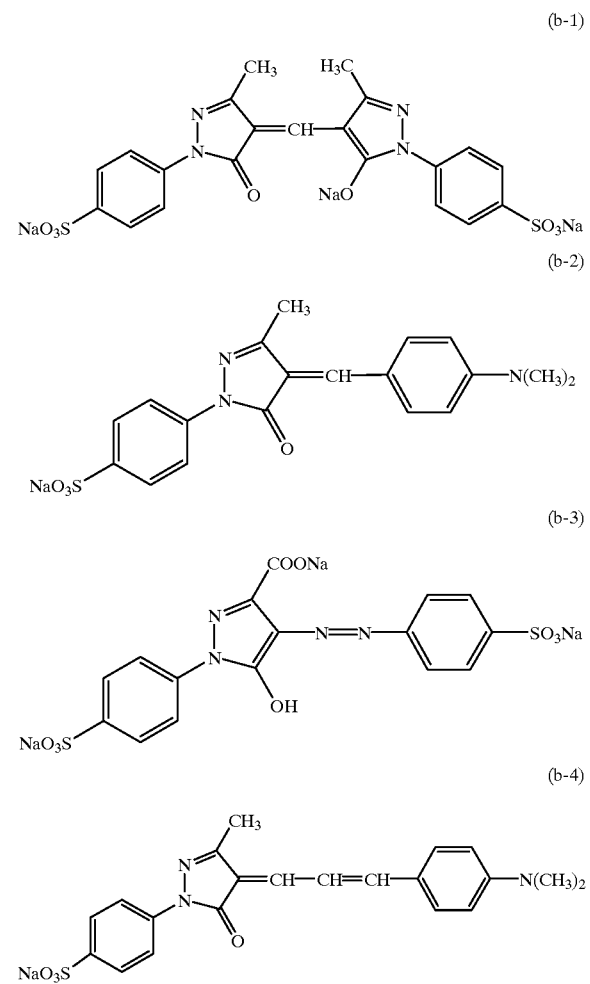

(b-5)
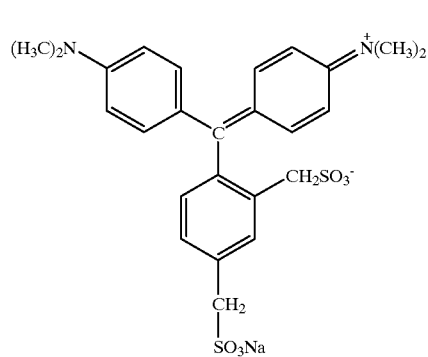
In the present invention, the pigment can be selected from a variety of pigments, but is required to be selected depending upon the spectral sensitivity wavelength of the silver halide emulsion. Typical examples of the pigments are as follows.
(c-1)
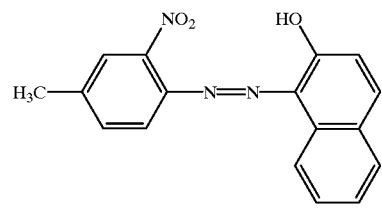
(c-2)
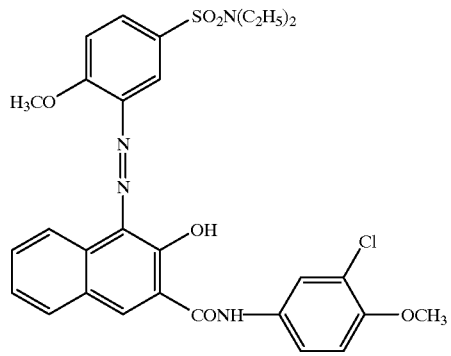
(c-3)
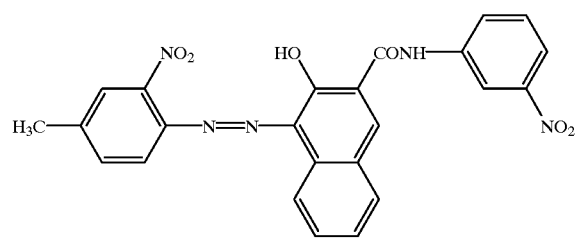
(c-4)
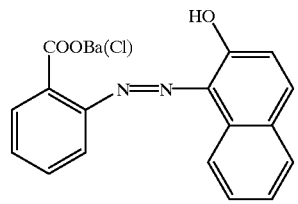
(c-5)
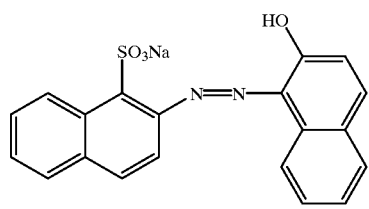
(c-6)
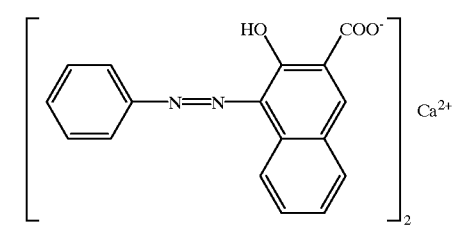
(c-7)
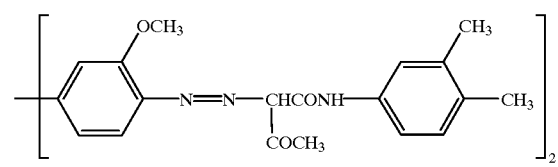
(c-8)
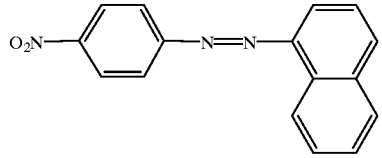
(c-9)
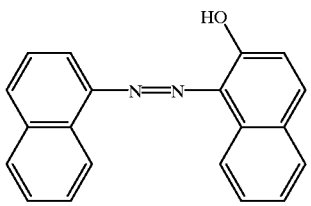
(c-10)
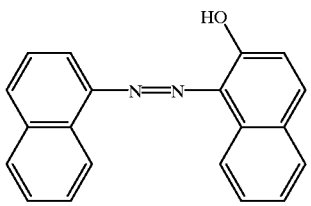
(c-11)
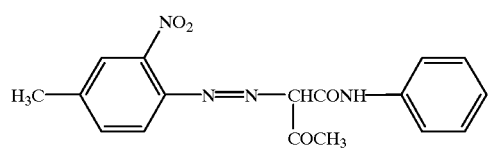

-continued

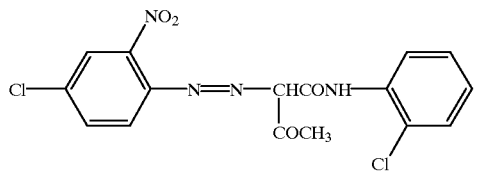

(c-12)

Shikisai Kagaku Hand Book (edited by Shikisai Kagaku Society, Nankodo) describes that an organic pigment has a size of 0.1 to 1.0 $\mu$m. However, although differing depending upon the kind of an organic pigment and dispersing conditions, an organic pigment generally causes secondary aggregation or tertiary aggregation in water to form a secondary or tertiary aggregate having a size of approximately 0.2 to 2.0 $\mu$m. In the present invention, the size of the pigment as a primary particle is preferably approximately 0.05 $\mu$m, and preferably, it is dispersed in water in the presence of a surfactant such as a nonionic or anionic surfactant and used as a water-base dispersion having an average particle diameter of 1.0 $\mu$m or less.

By incorporating the dye or the pigment into the hydrophilic colloid layer on the opposite side of the silver halide emulsion layer in the present invention, the hydrophilic colloid layer preferably has an absorbance of at least 0.30 in a maximum wavelength of (light emission intensity of a light source)×(spectral sensitivity of the silver halide emulsion) in the present invention. The light emission intensity of a light source represents the intensity of light of a light source measured at an individual wavelength, and it is a value obtained by measuring an intensity in terms of an energy quantity, multiplying the measured intensity with a multiplicative inverse of the wavelength and calculating a relative value of the number of photons. The light emission intensity can be easily measured with a commercially available emission spectrum measuring apparatus. The spectral intensity represents a photosensitivity to the constant number of incidence photons, and it can be measured by any method known in the field of this art and can be most easily measured with a spectrograph. The maximum wavelength of (light emission intensity of a light source)×(spectral sensitivity of the silver halide emulsion) represents a wavelength at which the photosensitive material substantially participates in the formation of an image to the highest degree. It is the wavelength of light of a light source when the light source is a monochromatic light source such as a laser or a light emitting diode.

In a preferred embodiment of the present invention, by incorporating the dye or the pigment into the silver halide emulsion layer, the absorbance of the dye or the pigment in the maximum wavelength of (light emission intensity of a light source)×(spectral sensitivity of the silver halide emulsion) is from at least 0.01 to 0.30 or less. The silver halide emulsion contains a substance such as sensitizing dyes which scatters or absorbs light, in addition to the silver halide particles, so that it is not necessarily easy to measure the silver halide emulsion for an absorbance of a dye or a pigment. The absorbance of the dye or the pigment is most easily determined on the basis of a difference between the absorbance of the silver halide emulsion containing the dye or the pigment and the silver halide emulsion containing neither the dye nor the pigment. When such is not possible, the dye or the pigment is added to a layer from which the substance such as sensitizing dyes which scatters or absorbs light has been removed, and the absorbance thereof can be determined.

As a binder for the hydrophilic colloid layer on the opposite side of the silver halide emulsion layer with regard to the glass substrate in the present invention, water-soluble binders which are known in the field of this art may be used alone or in combination. The water-soluble binder includes water-soluble gelatin, dextrin, gum arabic, polyvinyl alcohol or starch. In the present invention, the hydrophilic colloid layer may be hardened by incorporating a hardener known in the field of this art. Preferably, however, the removal with warm water after development is easier when no hardener is substantially added.

In a preferred embodiment of the present invention, the photomask of the present invention is exposed to a laser or a light emitting diode having a beam diameter of 30 $\mu$m or less. Specifically, the light source can be selected from all the light sources that are known in the field of this art, such as an argon ion laser, a helium neon laser, a semiconductor laser and a light emitting diode. Even a bundle of rays converged to a high degree has an output distribution in the form of a concentric circle having a maximum output in the center. In the present invention, the beam diameter refers to a diameter of a circle satisfying the output which is $1/e^2$ of the maximum output in the central area. While the beam of a rays-converged laser or light emitting diode is not always circular, the diameter of such a beam can be expressed as a diameter of a circle having an area equivalent to the area thereof.

In a preferred embodiment of the present invention, the photomask material has a layer made of a metal oxide between the glass substrate and the physical development center layer. The metal oxide in the present invention includes, for example, metal oxides such as colloidal silica, colloidal alumina, titanium oxide, zinc oxide and zirconium oxide and hydroxides of these. The colloidal silica includes a non-modified colloid of amorphous anhydrous silicic acid and modified colloidal silica prepared by modifying a silica surface with ions or compounds of ammonia, potassium and alumina to alter ionic properties of particles or the behavior of particles to a pH variation. The colloidal alumina refers to a colloidal substance which is of alumina hydrate having the form of amorphous or pseudo-boehmite (including a boehmite in a broad sense) and has a dispersion form of feather, fiber or plate. Further, the metal oxide includes smectites such as saponite, hectorite and montomorillonite, vermiculites, kaolinite-serpentinites such as kaolinite and halloysite, natural clay minerals such as sepiolite, fluorine micas such as fluorine gold mica, fluorine tetrasilicon mica and taeniolite, and synthetic inorganic polymers such as synthetic smectite.

The layer made of the above metal oxide or hydroxide can be formed by any method known in the field of this art. In the easiest method, the metal oxide or hydroxide is finely dispersed in a solvent, and the dispersion is applied onto a transparent substrate to retain the metal oxide or hydroxide thereon. In this case, the metal oxide or hydroxide in a finely dispersed state has a particle diameter of approximately 1 nm to 100 $\mu$m. The metal oxide or hydroxide retained on the transparent substrate may be heated to 150° C. or higher after dried, for improving the metal oxide particles in inter-particle bonding strength. When it is heated up to 600° C. or higher, the metal oxide is caused to grow. It is therefore preferred to heat the above metal oxide or hydroxide at a temperature between 150° C. and 500° C.

In a more preferred embodiment of the present invention, the photomask material has a layer made of titanium dioxide as a main component between the glass substrate and the physical development center layer. The layer made of titanium oxide (titanium dioxide) can be formed by applying a solution containing titanium oxide colloid onto the glass substrate and heating, by applying an organotitanium compound to the glass substrate and heating or by applying a titanium chelate liquid onto the glass substrate and heating.

The solution containing titanium oxide colloid is applied in the form of a dispersion of fine titanium oxide particles in water or an organic solvent such as an alcohol. The dispersion may contain a dispersion stabilizer or a surfactant for improving the dispersibility of the titanium oxide particles. The particle diameter of the titanium oxide particles is preferably 1 nm to 100 μm, more preferably 10 nm to 1 μm. The solution containing titanium oxide colloid in the present invention may be metal oxides such as contain colloidal silica, colloidal alumina, zinc oxide and zirconium oxide or hydroxides of these in addition of the titanium oxide. The solution containing titanium oxide colloid is applied onto the glass substrate, followed by drying and then heating. The heating temperature is 100° C. to 600° C., preferably 150° C. to 250° C.

Examples of the organotitanium compound in the present invention include tetraethyl orthotitanate, tetraisopropyl orthotitanate and tetrabutyl orthotitanate. The above organotitanium compound forms a layer of titanium oxide according to a sol-gel method. The sol-gel method refers to a method in which a glass or a ceramic or a thin layer is formed from a solution as a starting material through states of a sol containing fine particles and a subsequent state of a gel in which liquid or air is contained in gaps of a solid network (e.g., "Science of Sol-Gel Method". T. Sakka, published by Agune Syoufusha (1988), or "Sol-Gel Optics: Processing and Applications, Lisa C. Klein, published by Kluwer Academic Publishers (1994)). In the present invention, a solution containing a titanium compound is applied onto the glass substrate, reacting the titanium compound with water in air to gel a coating and then heating the coating to form a strong titanium oxide layer. The heating temperature is 450° C. to 600° C., preferably 450° C. to 550° C.

The titanium chelate liquid in the present invention refers to a chelating agent solution containing titanium. The chelating agent can be selected from a variety of chelating agents known in the field of this art, and typical examples thereof include aminopolycarboxylic acids such as ethylenediamine tetra acetate. The titanium chelate liquid in the present invention may contain an alkylamine such as dimethylamine or dipropylamine for improving the formability of a layer when it is applied. The titanium chleate solution is applied, and then, a formed coating is sintered to form a titanium oxide layer. The heating temperature is 450° C. to 600° C., preferably 450° C. to 550° C. The method of forming the titanium oxide layer from the titanium chelate liquid is described on pages 7 to 9 of the summary of the Lectures by Kiso-sakutai kogaku Society (Nov. 6, 1998).

The layer made of titanium oxide in the present invention preferably has a thickness of 1 μm or less. While the amount of the titanium oxide cannot be uniformly determined since its optimum amount differs depending upon the method of forming its layer, the above amount is preferably 0.01 to 1.00 g/m$^2$.

In a preferred embodiment of the present invention, the titanium oxide layer is irradiated with ultraviolet light after it is heated but before the physical development center layer is formed by application. While the ultraviolet light source is typically a high-pressure mercury lamp or a low-pressure mercury lamp, any light source known in the field of this art may be used.

In the photomask material of the present invention, an intermediate layer made of a hydrophilic colloid may be provided on or under the physical development center layer as required in addition to the silver halide emulsion layer and the physical development center layer. Otherwise, it may be formed as a protective layer.

The method of processing the photomask, provided by the present invention, the processing steps includes at least three steps of development, fixing and washing with water. Each step may be carried out in a plurality of vessels. The steps of development, fixing and washing with water in the present invention differ from the steps of development, fixing and washing with water concerning a general black and white silver halide photographic photosensitive material. The steps of development, fixing and washing with water in the present invention will be explained hereinafter.

In the processing method of the present invention, the development step is a step in which chemical development is carried out in a latent image center formed of silver halide in an exposed area by irradiation with light, silver halide in a non-exposed area is dissolved with a silver halide solvent to convert the silver halide to a soluble silver complex compound, the soluble silver complex compound diffuses through the silver halide emulsion layer and developed in a site where the physical development center is present, to form a silver layer. A developer solution for use in the present invention can contain a developing agent such as polyhydroxybenzenes or 3-pyrazolidinones; an alkaline substance such as potassium hydroxide, sodium hydroxide, lithium hydroxide, sodium tertiary phosphate or an amine compound; a preservative such as sodium sulfite; a thickener such as carboxymethyl cellulose; an antifoggant such as potassium bromide; a development modifier such as a polyoxyalkylene compound; and a silver halide solvent such as thiosulfate, thiocyanate or thiosalicylic acid. Preferably, the developer solution contains thiosulfate as a main silver halide solvent, and more preferably, it contains at least 0.02 mole/liter of thiosulfate. A developer solution for use in the DTR process contains an amine compound as a silver halide solvent in many cases. In a preferred embodiment of the present invention, however, the developer solution substantially does not contain any amine compound. The term "substantially does not contain" means that an amine compound is not contained in such an amount that the function thereof as a silver halide solvent is notably exhibited, and that even if an amine compound is contained, the amount of the amine compound is 1% by weight or less based on the developer solution. The pH of the developer solution is generally 10 to 14, preferably 12 to 14.

In the processing method of the present invention, the fixing step is a step in which the silver halide emulsion layer is removed, the glass substrate surface is exposed in a non-image area and a metal silver image is exposed in an image area. The pH of a fixing solution is at least 5, preferably 5.5 to 8, and the fixing solution preferably contains a pH buffer component. The pH buffer component can be selected from various components known in the field of this art. Examples of the pH buffer component usable in the fixing solution in the present invention include combinations of potassium hydrogenphthalate+hydrochloric acid, potassium hydrogenphthalate+sodium hydroxide, monopotassium dihydrogenphosphate+sodium hydroxide. The fixing solution may contain an antiseptic for preventing the decomposition of a removed gelatin.

The fixing solution used in the present invention contains a proteolytic enzyme. The proteolytic enzyme used in the present invention refers to an enzyme of a plant or animal origin and can be selected from various enzymes known in the field of this art. Examples of the proteolytic enzyme include pepsin, rennin, trypsin, chymotrypsin, cathepsin, papain, ficin, thrombin, renin, collagenase, bromelain and bacterium proteinase. Of these, trypsin, papain, ficin and bacterium proteinase are preferred. The amount of the proteolytic enzyme in the fixing solution in the present invention cannot be uniformly determined since the enzymatic activity differs depending upon a temperature and other additive. Preferably, the proteolytic enzyme is added in such an amount that the enzymatic activity per liter is 1,000 PUN to 1,000,000 PUN. The term "enzymatic activity" means the following. When 1 g of an enzyme is added to 5 ml of 0.6% milk casein (pH 7.5, M/25 phosphoric acid buffer solution) and allowed to react at 30° C. for 10 minutes, the activity of an enzyme which frees a Folin color corresponding to 1 $\mu$g of tyrosine per minute as a component soluble in TCS is taken as 1 PUN.

The fixing solution used in the present invention further contains a phosphate. The phosphate can be selected from phosphoric acid, disodium monohydrogenphosphate, monosodium dihydrogenphosphate or monopotassium dihydrogenphosphate. Further, the fixing solution is maintained at a temperature of 30° C. or higher. Preferably, it is maintained at a temperature between 32° C. and 45° C.

In a preferred embodiment of the present invention, when the silver halide emulsion is removed in the fixing step, the photomask material is immersed in the fixing solution in a fixing vessel, and when it is then drawn up out of the vessel, a fixing solution flow is blown to at least the silver halide emulsion surface of the photomask material. In a more preferred embodiment, the photomask material is immersed in the fixing solution in the fixing vessel, and then, a fixing solution flow is blown to at least the silver halide emulsion surface of the photomask material while the photomask material is reciprocally moved into and out of the fixing vessel. For this purpose, there can be employed procedures of fixing the photosensitive surface of the photosensitive material so as to stand vertically, immersing the photomask material in the fixing solution in the fixing vessel for a predetermined period of time and then blowing fixing solution to the photosensitive surface by pumping the fixing solution in the fixing vessel to eject it through a shower nozzle. A fixing solution flow may be also blown to the other surface opposite to the photosensitive surface with regard to the substrate.

In a preferred embodiment of the present invention, the processing method substantially does not include the step of physically rubbing the silver halide emulsion surface of the photomask. That is, the processing substantially does not include any step of removing the silver halide emulsion by rubbing the surface with a scrubbing roller slipping on the surface or by attaching a peel sheet and peeling the silver halide emulsion together. The silver halide emulsion is removed by simply using (blowing) the fixing solution flow as described above.

In a preferred embodiment of the present invention, the processing after the development includes at least one step of processing with a processing liquid having a pH of 7 or less. All or some of processing liquids for use after the development may have a pH of 7 or less. The processing liquid having a pH of 7 or less refers to water having a pH of 7 or less or a special processing liquid having a pH of 7 or less other than pure water.

The step of washing with water after the development and fixing is carried out for the same purpose as that in the step of washing with water regarding a general black and white silver halide photosensitive material. The purpose is to remove salts adhering to the surface, to prevent the deposition of salts and to prevent the deterioration of an image. For the photomask of the present invention, preferably, the final step of washing with water uses pure water for improving the gloss of an image made of metal silver. Washing with water can be carried out by various methods known in the field of this art. In the present invention, preferably, two pure water vessels are used or a vessel of tap water and a vessel of pure water are used, and at least in the final vessel, non-used pure water (not contaminated) is poured on both the surfaces of the photosensitive material when the photosensitive material drawn up after it is immersed.

A step for other purpose known in the field of this art may be carried out during the course of the above steps of development, fixing and washing with water. However, it is preferred not to include any other step between the step of development and the step of fixing.

The photomask material of the present invention is used for making a photomask which has high-definition image reproducibility, good image strength, heat resistance and durability against light (ultraviolet light) and is for use to form a circuit pattern, etc. According to the method of the present invention, further, the above photomask material can be effectively processed.

EXAMPLES

The present invention will be explained with reference to Examples hereinafter, while the present invention shall not be limited thereto.

Example 1

A palladium sulfide physical development center solution was prepared in an alkali-treated gelatin, and formalin in an amount corresponding to 0.1% of the weight of gelatin was added. The mixture was applied onto one surface of each of soda lime glass substrates such that the gelatin amount was 0.1 g/m$^2$ each and that the amount of a palladium sulfide center was 1.0 mg/m$^2$ each, and the thus-formed coatings were dried at room temperature and heated at 80° C. for 30 minutes to form a physical development center layer each.

The dye (b-2) shown previously was added to an alkali-treated gelatin, and the mixture was applied to the other surface of each of the soda lime glass substrates. The thus-formed coatings were dried to form a back coating each. Each back coating had an absorbance of 2.0 at 532 nm.

A silver halide emulsion was prepared as follows. An alkali-treated gelatin having an average molecular weight of 200,000 was provided, and by a control double jet method, there was prepared a silver bromoiodochloride which contained 15 mol % of silver bromide and 0.4 mol % of silver iodide, was doped with 0.006 mmol, per mole of the silver, of potassium hexachloroiridiate and had an average particle diameter of 0.25 $\mu$m. Then, the emulsion was desalted by a flocculation method. Further, the emulsion was sensitized with sulfur+gold, and was spectrally sensitized by adding 3 mg, per gram of the silver halide, of the sensitizing dye (a-3). Further, to the silver halide emulsion was added 10$^{-3}$ mol, per mole of the silver halide, of 1-phenyl-5-mercaptotetrazole. The thus-prepared silver halide emulsion was finally adjusted such that the content of gelatin per gram of the silver halide was 1.3 g. The silver halide emulsion was applied onto the physical development center layer of each of the glass substrates such that the application amount of the silver halide was 2 g/m$^2$, 4 g/m$^2$, 8 g/m$^2$ or 12 g/m$^2$, and the so-applied glass substrates were dried to obtain samples (1A) to (1D). For comparison, the silver halide emulsion layer containing a layer hardener was formed on a soda lime glass substrate having no physical development center layer formed, such that the application amount of the silver halide was 4 g/m², whereby an emulsion mask sample (1E) was obtained.

A 10 μm line and space image, 10 mm×10 mm square negative image and 10 mm×10 mm square positive image were outputted to each of the above samples (1A) to (iD) with an output machine using a 532 nm YAG laser as a light source with changing a laser power at a beam diameter of 2.5 μm at an image pitch of 0.5 μm. The samples were immersed in the following diffusion-transferring developer solution (25° C.) for 5 minutes, a silver halide emulsion layer was washed off with warm water having a temperature of 30° C., and the samples were dried. The samples were used as originals. Each sample was attached to a bright light film (DCL-EF supplied by Mitsubishi Paper Mills, Ltd.) and exposed to light with a contact printer (P-627-GA, supplied by Dainippon Screen Seizo K.K.), followed by development with a developer solution ("GEKKOL", supplied by Mitsubishi Paper Mills, Ltd.) at 35° C. for 20 seconds. A developed image was fixed with a fixing liquid ("DIA SUPER FIX" supplied by Mitsubishi Paper Mills, Ltd.), followed by washing with water and drying, to give image samples.

| Diffusion-transferring developer solution (1,000 ml) | |
|---|---|
| Sodium hydroxide | 20 g |
| Hydroquinone | 20 g |
| 1-Phenyl-3-pyrozolidinone | 2 g |
| Anhydrous sodium sulfite | 80 g |
| Monomethylethanolamine | 6 g |
| Anhydrous sodium thiosulfate | 6 g |
| Sodium ethylenediaminetetraacetate | 5 g |
| Deionized water | balance |
| pH (25° C.) = 12.8 | |

A 10 μm line and space image, 10 mm×10 mm square negative image and 10 mm×10 mm square positive image were outputted to the above sample (1E) with an output machine using a 532 nm YAG laser as a light source with changing a laser power at a beam diameter of 2.5 μm at an image pitch of 0.5 μm. The sample was subjected to development with a developer solution ("GEKKOL", supplied by Mitsubishi Paper Mills, Ltd.) at 15° C. for 3 minutes. A developed image was fixed with a fixing liquid ("DIA SUPER FIX" supplied by Mitsubishi Paper Mills, Ltd.) at 20° C. for 5 minutes, and the sample was washed with water and dried. The thus-obtained sample was used as an original. The original was attached to a bright light film (DCL-EF supplied by Mitsubishi Paper Mills, Ltd.) and exposed to light with a contact printer (P-627-GA, supplied by Dainippon Screen Seizo K.K.), followed by development with a developer solution ("GEKKOL", supplied by Mitsubishi Paper Mills, Ltd.) at 35° C. for 20 seconds. A developed image was fixed with a fixing liquid ("DIA SUPER FIX" supplied by Mitsubishi Paper Mills, Ltd.) at 30° C. for 30 seconds, followed by washing with water and drying, to give an image sample.

With regard to the image samples from the samples (1A) to (1E), an output at which line and space widths were equal to each other was taken as a proper exposure, and images obtained at said output were observed through a 100-powered magnifier. The samples were evaluated for image reproducibility on the basis of the following grades.

1. No image is reproduced.
2. An image is reproduced at any rate, but is fuzzy and unacceptable in practical use.
3. An image is reproduced and acceptable in practical use.
4. An image is reproduced and lines are sharp.
5. An image is reproduced and lines are very sharp without fringes.

Further, a silver image area of the 10 mm×10 mm square image of each sample was measured for a thickness at 10 points through an electron microscope, and an average of the measurement values was used as a thickness of the silver image area. Further, the central area of the silver image area of the 10 mm×10 mm square image of each sample was measured for white light transmitted density (difference from glass substrate in density) with a densitometer (Macbeth TR-927, supplied by Kollmorgen Instruments), and the measurement value was taken as a maximum transmittance density. Table 1 shows the results.

TABLE 1

| Sample | Maximum transmittance density | Thickness of silver image area | Image reproducibility |
|---|---|---|---|
| 1A | 0.7 | 0.2 μm | 2 |
| 1B | 1.5 | 0.4 μm | 4 |
| 1C | 2.6 | 0.8 μm | 3 |
| 1D | 3.5 | 1.2 μm | 2 |
| 1E | 6.0 or more | 6.0 μm | 1 |

Example 2

A palladium sulfide physical development center solution was prepared in a polyethylene glycol alkyl ether aqueous solution. The resultant solution was applied onto one surface of a soda lime glass substrate such that the amount of the palladium sulfide center was 1.0 mg/m², and the resultant coating was dried at room temperature and heated at 80° C. for 30 minutes to form a physical development center layer. A back coating was formed on the other surface of the glass substrate in the same manner as in Example 1.

The silver halide emulsion prepared in Example 1 was applied onto the above physical development center layer of the glass substrate such that the application amount of silver halide was 8 g/m², and the resultant coating was dried to obtain a sample (2A). The sample (2A) was treated in the same manner as in Example 1, to obtain an image sample. It was found that a water-soluble gelatin on the thus-prepared photomask had been completely removed with warm water. The photomask was evaluated according to the methods described in Example 1. Table 2 shows the results.

TABLE 2

| Sample | Maximum transmittance density | Thickness of silver image area | Image reproducibility |
|---|---|---|---|
| 2A | 2.9 | 0.08 μm | 4 |

Example 3

A colloidal silica ("Snowtex OUP, supplied by Nissan Chemical Industries, Ltd.) was applied onto a soda lime glass substrate so as to form a 0.2 μm thick layer, and the applied colloidal silica coating was dried at room temperature and heated at 150° C. for 30 minutes (the temperature in a furnace was increased to 150° C., and the glass substrate with the coating formed thereon was maintained at 150° C. for 30 minutes and then cooled to room temperature; time periods described in Examples to be described later show temperature-maintaining time periods and do not include any temperature-increasing and cooling time periods). A physical development center layer and a silver halide emulsion layer were formed thereon by application and drying in the same manner as in Example 2, to obtain a sample (3A). Further, a back coating was also formed on the reverse surface.

Tetra-n-butoxy zirconium (supplied by Nippon Soda Co., Ltd.) was applied onto a soda lime glass substrate so as to form a 0.1 μm thick layer, and the thus-formed coating was dried at room temperature and then heated at 450° C. for 1 hour. A physical development center layer and a silver halide emulsion layer were formed thereon by application and drying in the same manner as in Example 2, to obtain a sample (3B).

Titania sol (TA-15, supplied by Nissan Chemical Industries, Ltd.) was applied onto a soda lime glass substrate so as to form a 0.3 μm thick layer, and the thus-formed coating was dried at room temperature and then heated at 200° C. for 30 minutes. A physical development center layer and a silver halide emulsion layer were formed thereon by application and drying in the same manner as in Example 2, to obtain a sample (3C).

The samples (3A) to (3C) were treated in the same manner as in Example 1 to image samples, and evaluated in the same manner as in Example 1. Table 3 shows the results.

TABLE 3

| Sample | Maximum transmittance density | Thickness of silver image area | Image reproducibility |
|---|---|---|---|
| 3A | 3.6 | 0.06 μm | 4–5 |
| 3B | 3.3 | 0.07 μm | 4–5 |
| 3C | 4.5 | 0.08 μm | 5 |

Example 4

A palladium sulfide physical development center solution was prepared in a polyethylene glycol alkyl ether aqueous solution. The resultant solution was applied onto one surface of a soda lime glass substrate such that the amount of the palladium sulfide center was 1.0 mg/m², and the resultant coating was dried at room temperature and heated at 80° C. for 30 minutes to form a physical development center layer. A back coating was formed on the other surface of the glass substrate in the same manner as in Example 1. In this manner, glass substrates having the physical development center layer formed thereon each were prepared.

The silver halide emulsion prepared in Example 1 was used. The weight of the gelatin per unit weight of the silver halide was changed to prepare various silver halide emulsions, and each emulsion in different amounts was applied to the physical development center layers of the above glass substrates to obtain samples (4A) to (4D).

The samples (4A) to (4D) were cut sliced with an acute cutter, and each of the cross sections was observed through an electron microscope to show that silver halide particles were uniformly distributed in the silver halide emulsion in each sample. The silver halide emulsion layer was measured for a thickness in 10 points of each sample, and an average value in each sample was used as a thickness×(μm) of the silver halide emulsion layer. Further, the amount Y (mol/m²) of the actually applied silver halide in each sample was measured with a fluorescence X-ray analyzer system (model 3270, supplied by K.K. Rigakusha). On the basis of these data, the thickness Z (μm) of the silver halide emulsion layer on the basis of $1 \times 10^{-2}$ mol of the silver halide particles per 1 m² was calculated according to the following equation. Table 4 shows the results.

$$Z = 1 \times 10^{-2} \times X/Y$$

A 10 μm line and space image was outputted to each of the above samples (4A) to (4G) with an output machine using a 532 nm YAG laser as a light source with changing a laser power at a beam diameter of 2.5 μm at an image pitch of 0.5 μm. Each sample was immersed in the same diffusion-transferring developer solution (25° C.) as that used in Example 1 for 5 minutes, the silver halide emulsion layer of each sample was washed off with warm water at 30° C., and the samples were dried to give image samples.

With regard to the image samples from the samples (4A) to (4G), an output at which line and space widths were equal to each other was taken as a proper exposure, and image areas (positive line areas) were observed through an optical microscope to study sharpness of edge areas. The results were evaluated on the basis of the following grades.

1. Extremely fuzzy.
2. Fuzzy.
3. Sharp, but slight fringes were found.
4. Very sharp, and no fringes were found.

The above test image samples were fine images. While sharp reproduction is not an essential performance which photomask materials are required to exhibit, studying reproduction is the optimum method for evaluating differences in performance. Table 4 shows the results.

Further, non-image areas (negative line areas) were observed for fine black spots, and the results were evaluated on the basis of the following grades.

1. A large number of fine black spots occurred.
2. A small number of fine black spots occurred.
3. A slight number of fine black spots occurred in edge areas of lines.
4. No fine black spots occurred.

While the above fine black spots do not always have an influence on practical use as a photomask, and do not constitute an essential performance. However, studying the fine black spots is the optimum method for evaluating differences in performance. Table 4 shows the results.

TABLE 4

| Sample | Y (mol/m²) | Z (μm) | Grade of edge sharpness | Grade of fine black spots |
|---|---|---|---|---|
| 4A | $8.0 \times 10^{-2}$ | 1.5 | 2 | 2 |
| 4B | $8.0 \times 10^{-2}$ | 3.0 | 1 | 1 |
| 4C | $4.0 \times 10^{-2}$ | 1.5 | 2 | 2 |
| 4D | $4.0 \times 10^{-2}$ | 3.0 | 1 | 1 |
| 4E | $2.0 \times 10^{-2}$ | 1.5 | 2 | 2 |
| 4F | $2.0 \times 10^{-2}$ | 3.0 | 1 | 1 |
| 4G | $0.5 \times 10^{-2}$ | 1.5 | 1 | 1 |

Example 5

In the same manner as in the preparation of the sample 3C in Example 3, a titania sol (TA-15, supplied by Nissan Chemical Industries, Ltd.) was applied onto a soda lime glass substrate so as to form a 0.3 μm thick layer, and the thus-formed coating was dried at room temperature and then heated at 200° C. for 30 minutes.

Then, the same physical development center layer as that in Example 4 was formed thereon. In this manner, glass substrates having the physical development center layer formed each were prepared. The same silver halide emulsions as those in Example 4 were applied onto the physical development center layers in the same manner as in Example 4, to obtain samples (5A) to (5F) for which the application amounts of the silver halide emulsion were different and which had silver halide emulsion layers different in thickness corresponding to $1 \times 10^{-2}$ mol of the silver halide particles per 1 m². Further, the same back coating layer as that in Example 1 was formed on the reverse surface of each sample. The samples (5A) to (5F) were exposed to light, and formed images were developed, in the same manner as in Example 4, and obtained photomask samples were evaluated on edge sharpness and fine black spots. Table 5 shows the results.

TABLE 5

| Sample | Y (mol/m²) | Z (μm) | Grade of edge sharpness | Grade of fine black spots |
| --- | --- | --- | --- | --- |
| 5A | $8.0 \times 10^{-2}$ | 0.8 | 4 | 4 |
| 5B | $8.0 \times 10^{-2}$ | 1.5 | 3 | 4 |
| 5C | $4.0 \times 10^{-2}$ | 0.8 | 4 | 4 |
| 5D | $4.0 \times 10^{-2}$ | 1.5 | 3 | 3 |
| 5E | $2.0 \times 10^{-2}$ | 1.5 | 3 | 4 |
| 5F | $2.0 \times 10^{-2}$ | 1.4 | 3 | 3 |

Example 6

A palladium sulfide physical development center layer solution was prepared, a low-molecular-weight gelatin having an average molecular weight of 3,000 was added, and the resultant solution was applied onto one surface of a soda lime glass substrate such that the palladium sulfide center amount was 1.0 mg/m² and that the low-molecular-weight gelatin amount was 0.1 g/m². The thus-formed coating was dried. A back coating as in Example 1 was formed on the other surface of the soda lime glass substrate.

The same silver halide emulsion as that prepared in Example 1 was applied onto the physical development center layer of the glass substrate such that the application amount of the silver halide was 8 g/m², and the resultant coating was dried to obtain a sample (6A). Further, there was provided a glass substrate having a surface coated with a physical development center layer which was the same as the above physical development center layer except that no low-molecular-weight gelatin was incorporated. A silver halide emulsion layer was formed on the physical development center layer in the same manner as above, to obtain a sample (6B).

A 20 μm line and space image was outputted to each of the above samples (6A) and (6B) with an output machine using a 532 nm YAG laser as a light source with changing a laser power at a beam diameter of 2.5 μm at an image pitch of 0.5 μm. Each sample was immersed in the same diffusion-transferring developer solution (25° C.) as that used in Example 1 for 5 minutes, the silver halide emulsion layer of each sample was washed off with warm water at 30° C., and the samples were dried to give image samples.

With regard to the image samples from the samples (6A) and (6B), an output at which line and space widths were equal to each other was taken as a proper exposure, and the image samples were evaluated on the basis of the same grades as those in Example 4.

TABLE 6

| Sample | Grade of fine black spots |
| --- | --- |
| 6A | 2 |
| 6B | 1 |

Example 7

In the same manner as in the preparation of the sample 3C in Example 3, a titania sol (TA-15, supplied by Nissan Chemical Industries, Ltd.) was applied onto one surface of a soda lime glass substrate so as to form a 0.3 μm thick layer, and the thus-formed coating was dried at room temperature and then heated at 200° C. for 30 minutes.

Then, the same physical development center layer as that formed in Example 6 was formed thereon. The same silver halide emulsion as that used in Example 6 was applied onto it in the same manner as in Example 6, to obtain a sample (7A). A back coating layer was also formed on the other surface of the soda lime glass substrate in the same manner as in Example 1. The sample (7A) was exposed, and an image was developed, in the same manner as in Example 6. The image was evaluated for fine black spots in the same manner as in Example 6. Table 7 shows the result.

TABLE 7

| Sample | Grade of fine black spots |
| --- | --- |
| 7A | 2 |

Example 8

A palladium sulfide physical development center solution was prepared in a polyethylene glycol alkyl ether aqueous solution. The thus-prepared physical development center solution was applied onto one surface of the same titania-sol-applied glass substrate as that prepared in Example 7 such that the amount of the palladium sulfide center was 1.0 g/m², and the coating was dried to form a physical development center layer. A back coating layer was formed on the other surface of the glass substrate in the same manner as in Example 1.

A low-molecular-weight gelatin having an average molecular weight of 3,000 was added to the same silver halide emulsion as that in Example 6. The thus-prepared silver halide emulsion was applied onto the physical development center layer such that the application amount of silver halide was 8 g/m² and that the amount of the low-molecular-weight, gelatin was 0.5 g/m², and the so-formed coating was dried to obtain a sample (8A). Further, samples (8B), (8C) and (8D) were prepared in the same manner as in the preparation of the sample (8A) except that the average molecular weight of the low-molecular-weight gelatin was changed to 10,000, 30,000 and 50,000. Further, a sample (8E) was also prepared in the same manner except that the low-molecular-weight gelatin was not added.

The samples (8A) to (8E) were exposed to light, and images were developed, in the same manner as in Example 7. The images were evaluated for fine black spots in the same manner as in Example 1. Table 8 shows the result.

TABLE 8

| Sample | Grade of fine black spots |
| --- | --- |
| 8A | 4 |
| 8B | 4 |
| 8C | 4 |
| 8D | 3 |
| 8E | 1 |

Example 9

A palladium sulfide physical development center solution was prepared in an alkali-treated gelatin, formalin in an amount corresponding to 0.1% of the gelatin weight was added, and the mixture was applied onto a soda lime glass substrate such that the gelatin amount was 0.05 g/m$^2$ and the palladium sulfide center amount was 1 mg/m$^2$. The thus-formed coating was dried at room temperature and heated at 80° C. for 30 minutes. The physical development center layer had a thickness of 0.05 µm.

The same silver halide emulsion as that used in Example 1 was applied onto the physical development center layer such that the application amount of silver halide was 8 g/m$^2$, and the thus-formed coating was dried to obtain a sample (9A). Further, samples (9B) and (9C) were prepared in the same manner as in the preparation of the sample (9A) except that physical development center layers were formed such that gelatin amounts were 0.1 g/m$^2$ and 0.15 g/m$^2$. Each physical development center layer had a thickness of 0.10 µm or 0.15 µm.

The above samples (9A) to (9C) were immersed in the same diffusion-transferring developer solution (20° C.) as that used in Example 1 for 5 minutes, the silver halide emulsion layers were washed off with warm water at 30° C., and the samples were dried.

Metal silver image areas of developed samples from the samples (9A) to (9C) were measured for a pencil hardness according to the method specified in JIS-K-5400. Table 9 shows the results.

TABLE 9

| Sample | Pencil hardness |
| --- | --- |
| 9A | 3H |
| 9B | 2H |
| 9C | 2B |

Hard masks which are evaluated to have a high hardness in the field of this art have a hardness of 5H. Emulsion masks which are evaluated to have a relatively low hardness and to be therefore easily damaged in the field of this art have a hardness of 5B to 4B, and they show a hardness of approximately 2B to B when they are laminated. Since the emulsion masks are used in the field of this art, masks having a hardness of approximately 5B can be used with taking care of their handling. There is therefore no distinct threshold value concerning the hardness required of a photomask. In view of easiness in handling, a photomask having a higher hardness is more preferred.

Example 10

In the same manner as in the preparation of the sample 3C in Example 3, a titania sol (TA-15, supplied by Nissan Chemical Industries, Ltd.) was applied onto one surface of a soda lime glass substrate so as to form a 0.3 µm thick layer, and the thus-formed coating was dried at room temperature and then heated at 200° C. for 30 minutes.

A palladium sulfide physical development center solution was prepared in a polyethylene glycol alkyl ether aqueous solution, and the thus-prepared solution was applied onto the titania-sol-coated surface of the glass substrate such that the amount of polyethylene glycol alkyl ether was 0.1 g/m$^2$ and that the palladium sulfide center amount was 1 mg/m$^2$, and the thus-formed coating was dried. The physical development center layer had a thickness of 0.1 µm.

The same silver halide emulsion as that used in Example 10 was applied onto the physical development center layer of the glass substrate such that the amount of silver halide was 8 g/m$^2$, and the thus-formed coating was dried to obtain an sample (10A). Further, a sample (10B) was prepared in the same manner as in the preparation of the sample (10A) except that the solution for a physical development center layer was applied such that the amount of polyethylene glycol alkyl ether was 1 mg/m$^2$. The samples (10A) and (10B) were processed in the same manner as in Example 9, and evaluated for a pencil hardness in the same manner as in Example 9. Table 10 shows the results.

TABLE 10

| Sample | Pencil hardness |
| --- | --- |
| 10A | 5H |
| 10B | 6H |

Example 11

A palladium sulfide physical development center solution was prepared in an alkali-treated gelatin, formalin in an amount corresponding to 0.1% of the gelatin weight was added, and the mixture was applied onto soda lime glass substrates such that the gelatin amount was 0.1 g/m$^2$ each and that the palladium sulfide center amount was 1.0 mg/m$^2$ each. The thus-formed coatings were dried at room temperature and heated at 80° C. for 30 minutes.

A silver halide emulsion was prepared by the following method. By a silver ion concentration control double jet method in which a silver nitrate aqueous solution and an aqueous solution containing halide ions of sodium chloride, potassium bromide and potassium iodide into an alkali-treated gelatin aqueous solution, there were prepared 12 kinds of silver bromoiodochloride emulsions which had silver bromide and silver iodide contents shown in Table 11, had an average particle diameter of 0.25 µm and were doped with 0.006 mmol, per mole of the silver, of potassium hexachloroiridiate. Then, these emulsions were desalted by a flocculation method. Further, these emulsions were sensitized with sulfur+gold, and were spectrally sensitized by adding 3 mg, per gram of the silver halide, of the sensitizing dye (a-3) each. Further, 10$^{-3}$ mol, per silver halide, of 1-phenyl-5-mercaptotetrazole was added to each silver halide emulsion. Each of the thus-prepared silver halide emulsions was finally adjusted such that the content of gelatin per gram of the silver halide was 1.3 g. The silver halide emulsions were applied onto the physical development center layers of the glass substrates such that the application amount of the silver halide was 8 g/m$^2$ each, and the thus-formed coatings were dried to obtain samples (11A) to (11L).

The above samples (11A) to (11L) were immersed in the following diffusion-transferring developer solution (20° C.)

for 5 minutes, and the silver halide emulsion layer of each sample was washed off with warm water at 30° C., followed by drying.

| Diffusion-transferring developer solution (1,000 ml) | |
| --- | --- |
| Sodium hydroxide | 20 g |
| Hydroquinone | 20 g |
| 1-Phenyl-3-pyrozolidinone | 2 g |
| Anhydrous sodium sulfite | 80 g |
| Monomethylethanolamine | 6 g |
| Sodium ethylenediaminetetraacetate | 5 g |
| Deionized water | balance |
| pH (25° C.) = 12.8 | |

Metal silver image areas of the developed samples from the samples (11A) to (11L) were evaluated for pencil hardness in the same manner as in Example 9. Table 11 shows the results.

Further, the silver image area of each of the samples (11A) to (11L) was scrubbed with a piece of gauze containing ethyl alcohol to study a degree of damage of the images. The results were evaluated as scrubbing strength on the basis of the following grades.

1. Image was extremely damaged.
2. Image was partly damaged.
3. Image had no problem as a transmission image but had flaws thereon.
4. The gloss of a silver image was low, but the image had no problem as a transmission image.
5. No problem It cannot necessarily be said that the above evaluation by observing an image scrubbed with a piece of gauze containing ethyl alcohol for damage of the image is proper for evaluating the image strength of a photomask. Evan a photomask which is evaluated to have a grade of 1 above can be used as a photomask with taking care of its handling. There is no distinct threshold value that 5 determines the required degree of the strength. In view of easiness in handling, a photomask having a higher image strength is more preferred. Table 11 shows the results.

TABLE 11

| Sample | Silver bromide content | Silver iodide content | Pencil hardness | Scrubbing strength |
| --- | --- | --- | --- | --- |
| 11A | 0% | 0.0% | 3B | 1 |
| 11B | 1 | 0.0 | B | 1 |
| 11C | 3 | 0.0 | H | 3 |
| 11D | 15 | 0.0 | H | 3 |
| 11E | 40 | 0.0 | H | 3 |
| 11F | 70 | 0.0 | 2B | 2 |
| 11G | 100 | 0.0 | 3B | 1 |
| 11H | 15 | 0.1 | 2H | 3 |
| 11I | 15 | 0.3 | 2H | 3 |
| 11J | 15 | 0.5 | 2H | 3 |
| 11K | 15 | 1.0 | 2H | 3 |
| 11L | 15 | 1.5 | H | 3 |

Example 12

Samples (12A) to (12C) were prepared in the same manner as in the preparation of the sample (11I) except for the following. The step of preparing the silver halide emulsion for the sample (11) in Example 11 was divided into first and second steps; the first step in which 95% of the total growth of silver halide particles was completed and the second step in which the rest of the growth was completed. While the total iodide ion content was maintained at a constant value (0.3 mol %) as a total of iodide contents in the first and second steps, the allocation ratio of the iodide ion contents in the aqueous solution containing halogen ions in the first and second steps was changed as shown in Table 12.

Further, a sample (12D) was prepared in the same manner as in the preparation of the sample (12C) except that the step of preparing the silver halide emulsion for the sample (12C) was divided into first and second steps; the first step in which 90% of the total growth of silver halide particles was completed and the second step in which the rest of the growth was completed.

The samples (12A) to (12D) were exposed to light, and images were developed, in the same manner as in Example 11, and the images were evaluated for strength in the same manner as in Example 11. Table 12 shows the results.

TABLE 12

| Sample | Timing of switching of halogen solutions | Alocation ratio of silver iodide | | Pencil hardness | Scrubbing strength |
| --- | --- | --- | --- | --- | --- |
| | | Before switching | After switching | | |
| 12A | 95 mol % | 30% | 70% | 2H | 3 |
| 12B | 95 mol % | 10% | 90% | 3H | 3 |
| 12C | 95 mol % | 0% | 100% | 3H | 3 |
| 12D | 90 mol % | 0% | 100% | 2H | 3 |

Example 13

A sample (13A) was prepared in the same manner as in the preparation of the sample (11D) in Example 11 except that a potassium iodide aqueous solution was added after the formation of the silver halide particles in the step of preparing the silver halide emulsion so that a surface of each silver halide particle was converted to silver iodide by an amount corresponding to 0.3 mol % of the total of the silver halide. In the above method, the region of each silver halide particle which region is present within 1% in terms of a molecular weight from the surface is converted to silver iodide. The sample (13A) was exposed to light, and an image was developed, in the same manner as in Example 11, and the image was evaluated for strength in the same manner as in Example 11. Table 13 shows the results.

TABLE 13

| Sample | Ratio of non-converted silver halide area | Allocation ratio of silver iodide | | Pencil hardness | Scrubbing strength |
| --- | --- | --- | --- | --- | --- |
| | | Non-converted area | Converted area | | |
| 13A | 90 mol% or more | 0% | 100% | 4H | 3 |

Example 14

In the same manner as in the preparation of the sample 3C in Example 3, a titania sol (TA-15, supplied by Nissan Chemical Industries, Ltd.) was applied onto one surface of each of soda lime glass substrates so as to form a 0.3 $\mu$m thick layer, and the thus-formed coatings were dried at room temperature and then heated at 200° C. for 30 minutes.

A palladium sulfide physical development center solution was prepared in a polyethylene glycol alkyl ether aqueous solution, and the thus-prepared solution was applied onto the titania-sol-coated surfaces of the glass substrates such that the amount of polyethylene glycol alkyl ether was 0.1 g/m² each and that the palladium sulfide center amount was 1 mg/m² each, and the thus-formed coatings were dried.

The same silver halide emulsions as those for the samples (11D) and (11I) in Example 11, the sample (12C) in Example 12 and the sample (13A) in Example 13 were applied onto the above physical development center layers in the same manner as in the preparation of these samples, to obtain samples (14A) to (14D).

The samples (14A) to (14D) were exposed to light, and images were developed, in the same manner as in Example 11, and the images were evaluated for strength in the same manner as in Example 11. Table 14 shows the results.

TABLE 14

| Sample | Silver halide emulsion | Pencil hardness | Scrubbing strength |
|---|---|---|---|
| 14A | the same emulsion as that for sample (11D) | 3H | 4 |
| 14B | the same emulsion as that for sample (11I) | 4H | 4 |
| 14C | the same emulsion as that for sample (12C) | 4H | 4 |
| 14D | the same emulsion as that for sample (13A) | 5H | 4 |

Example 15

To the same developer solution as that used in Example 11 was added 0.04 mol/liter of anhydrous sodium thiosulfate, and the same samples as the samples (1D) and (11I) in Example 11, the sample (12C) in Example 12, the sample (13A) in Example 13 and the sample (14D) in Example 14 subjected to development with the above-prepared developer solution at 20° C. for 5 minutes. Then, the silver halide emulsion layers were washed off with warm water at 30° C., and the samples were dried to obtain samples (15A) to (15E) for evaluation of image strength. Further, the same sample as the above sample (14D) was subjected to development with a developer solution prepared by adding 0.01 mol/liter, 0.02 mol/liter or 0.10 mol/liter of anhydrous sodium thiosuflate to the same developer solution as that used in Example 11, to obtain samples (15F) to (15H) for evaluation of image strength. The samples (15A) to (15H) were evaluated for image strength in the same manner as in Example 11. Table 15 shows the results.

TABLE 15

| Sample | Pencil hardness | Scrubbing strength |
|---|---|---|
| 15A | 2H | 4 |
| 15B | 4H | 4 |
| 15C | 4H | 4 |
| 15D | 5H | 4 |
| 15E | 6H | 5 |
| 15F | 5H | 4 |
| 15G | 6H | 5 |
| 15H | 6H or higher | 5 |

Example 16

A palladium sulfide physical development center solution was prepared in an alkali-treated gelatin in the same manner as in Example 1, and formalin in an amount equivalent to 0.1% of the weight of the gelatin was added. The mixture was applied onto one surface of each of soda lime glass substrates such that the gelatin amount was 0.1 g/m² each and that the palladium sulfide physical development center amount was 1.0 mg/m² each, and the thus-formed coatings were dried at room temperature and then heated at 80° C. for 30 minutes.

The dye (b-1) was added to an alkali-treated gelatin to prepare gelatins containing four different amount levels of the dye (b-1). The thus-prepared gelatins were applied onto the other surface of each of the glass substrate and dried to form a hydrophilic colloid layer (back coating layer) on the other surface of each.

A silver halide emulsion having an average particle diameter of 0.13 µm was prepared by a control double jet method using an alkali-treated gelatin. Then, the emulsion was desalted by a flocculation method. To the silver halide emulsion was added $10^{-3}$ mol, per mole of the silver halide, of 1-phenyl-5-mercaptotetrazole. The thus-prepared silver halide emulsion was finally adjusted such that the content of gelatin per gram of the silver halide was 1.0 g. The silver halide emulsion was applied onto the physical development center layer of each of the glass substrates such that the application amount of the silver halide was 8 g/m² each, and the so-applied glass substrates were dried to obtain samples (16A) to (16D).

The following two images were contacted to each of the samples (16A) to (16D), and the samples were exposed to light, with a contact printer (P-627-FM supplied by Dainippon Screen Seizo K.K.). Each sample was immersed in the same diffusion-transferring developer solution (20° C.) as that used in Example 1 for 5 minutes, and the silver halide emulsion layers were washed off with warm water at 30° C. An exposure dose at which an average positive line width (line width A) of two lines in the center of the image (A) 40 µm was taken as a proper exposure, and evaluation samples were obtained.

Image (A): 10 lines and spaces having a line width of 40 µm

Image (B): one positive line having a line width of 40 µmim

The evaluation samples from the samples (16A) to (16D) were measured for a line width (line width B) of the image (B). Table 16 shows the results.

Further, in this case, a wavelength at which (light emission intensity of exposure light source)×(spectral sensitivity of the silver halide emulsion) was the largest was studied to show 365 nm at which the light emission from a mercury lamp light source was the largest. Table 16 shows absorbance values of the samples (16A) to (16D) at 365 nm.

TABLE 16

| Sample | Absorbance of back coating layer | Line width A | Line width B |
|---|---|---|---|
| 16A | 0.00 | 40 µm | 10 µm |
| 16B | 0.16 | 40 µm | 10 µm |
| 16C | 0.30 | 40 µm | 19 µm |
| 16D | 0.55 | 40 µm | 20 µm |

Example 17

Samples (17A) to (17D) were prepared in the same manner as in the preparation of the sample (16D) in Example 16 except that the dye (b-1) was added to the silver halide emulsion to prepare emulsions containing four different amount levels of the dye (b-1). These samples were exposed to light, and images were developed, in the same manner as in Example 16 to obtain evaluation samples. Each evaluation sample was measured for a reproduced line width. Table 17 shows the results. Further, Table 17 shows absorbance values of the dye in the emulsion layers at a wavelength at which the (light emission intensity of exposure light source)×(spectral sensitivity of the silver halide emulsion) was the largest, i.e., 365 nm.

TABLE 17

| Sample | Absorbance of emulsion layer | Line width A | Line width B |
|---|---|---|---|
| 17A | 0.01 | 40 μm | 25 μm |
| 17B | 0.20 | 40 μm | 30 μm |
| 17C | 0.30 | 40 μm | 26 μm |
| 17D | 0.55 | 40 μm | 17 μm |

Example 18

In the same manner as in the preparation of the sample 3C in Example 3, a titania sol (TA-15, supplied by Nissan Chemical Industries, Ltd.) was applied onto one surface of each of soda lime glass substrates so as to form a 0.3 μm thick layer, and the thus-formed coatings were dried at room temperature and then heated at 200° C. for 30 minutes.

A palladium sulfide physical development center solution was prepared in a polyethylene glycol alkyl ether aqueous solution, and the thus-prepared solution was applied onto the titania-sol-coated surfaces of the glass substrates such that the amount of polyethylene glycol alkyl ether was 0.1 g/m² each and that the palladium sulfide center amount was 1 mg/m² each, and the thus-formed coatings were dried.

The same back coating layer as that of the samples (16D) and (17B) were formed on the other surface of each of the glass substrates, and the same silver halide emulsion layers as those of the samples (16D) and (17B) were formed on the physical development center layers of the glass substrates, to obtain samples (18A) and (18B). The samples (18A) and (18B) were exposed to light, and images were developed, in the same manner as in Example 16, to obtain evaluation samples. Each evaluation sample was measured for a width of a reproduced line. Table 18 shows the results.

TABLE 18

| Sample | Line width A | Line width B |
|---|---|---|
| 18A | 40 μm | 30 μm |
| 18B | 40 μm | 35 μm |

Example 19

The dye (b-2) was added to an alkali-treated gelatin to obtain a coating liquid. A glass substrate on which the same physical development center layer as that formed in Example 16 was formed was prepared in the same manner as in Example 16. For forming a hydrophilic colloid layer (back coating layer), the above coating liquid was applied onto the surface of the glass substrate which surface was opposite to the surface on which the physical development center layer was formed.

By a control double jet method using an alkali-treated gelatin, there was prepared a silver bromoiodochloride emulsion having an average particle diameter of 0.25 μm and having a silver bromide content of 15 mol %, a silver iodide content of 0.4 mol %. The emulsion was desalted by a flocculation method. Further, the emulsion was sensitized with sulfur+gold and spectrally sensitized by adding 3 mg, per gram of the silver halide, of the sensitizing dye (a-3). Further, to the silver halide emulsion was added $10^{-3}$ mol. per mole of the silver halide, of 1-phenyl-5-mercaptotetrazole. The thus-prepared silver halide emulsion was finally adjusted such that the content of gelatin per gram of the silver halide was 1.0 g. The silver halide emulsion was applied onto the physical development center layer of the glass substrate and the so-applied glass substrate was dried to obtain a sample (19A).

Further, a sample (19B) was prepared in the same manner as in the preparation of the sample (19A) except that the dye (b-2) was added to the silver halide emulsion. Further, a sample (19C) was prepared in the same manner as in the preparation of the sample (19A) except the silver halide emulsion was applied onto the same physical development center layer which was formed on a glass substrate through a titania layer in the same manner as in Example 18. The images (A) and (B) shown in Example 16 were outputted to the samples (19A) to (19C) with an output machine using a light emitting diode (light emission wavelength 450 nm) having a beam diameter of 30 μm as a light source while changing an exposure dose, and the images were developed in the same manner as in Example 16 to obtain evaluation samples. Each evaluation sample was measured for a reproduced line width. Table 19 shows the results.

When the above exposure light source is used, the wavelength at which the (light emission intensity of exposure light source)×(spectral sensitivity of the silver halide emulsion) is the largest is 450 nm. Table 19 shows absorbance values of the back coating layers of the samples (19A) to (19C) at 450 nm and the absorbance values of the dye in the silver halide emulsion layers thereof at 450 nm.

TABLE 19

| Sample | Absorbance of back coating layer | Absorbance of emulsion layer | Line width A | Line width B |
|---|---|---|---|---|
| 19A | 0.55 | 0.00 | 40 μm | 25 μm |
| 19B | 0.55 | 0.20 | 40 μm | 34 μm |
| 19C | 0.55 | 0.20 | 40 μm | 40 μm |

Example 20

A sample (20A) was prepared in the same manner as in the preparation of the sample (19C) except that $3.0\times10^{-6}$ mol, per mole of the silver halide, of potassium hexachloroiridate was added in the step of growing silver halide particles. Further, samples (20B) and (20C) were prepared in the same manner as in the preparation of the samples (19C) and (20A) except that $4.0\times10^{-7}$ mol, per mole of the silver halide, of rhodium trichloride was added in the step of growing silver halide particles.

The following images (C) and (D) were outputted to the samples (20A) to (20C) with an output machine using a YAG laser having a beam diameter of 5 μm as a light source while changing an exposure dose, and the images were developed in the same manner as in Example 16. An exposure dose at which the average positive line width (line width A) of two fine lines in the center of the image (C) was 20 μm was taken as a proper exposure, and evaluation samples were obtained.

Image (C): 10 lines and spaces having a line width of 20 μm

Image (D) one positive line having a line width of 20 μm

Each of the evaluation samples from the samples (19C) and (20A) to (20C) was measured for a line width (line width D) of the image (D). Table 20 shows the results.

When the above light source is used, the wavelength at which the (light emission intensity of exposure light source)×(spectral sensitivity of the silver halide emulsion) is the largest is 532 nm. Table 20 shows absorbance values of the back coating layers of the samples (19A) and (20A) to (20C) at 532 nm and the absorbance values of the dye in the silver halide emulsion layers thereof at 532 nm.

TABLE 20

| Sample | Absorbance of back coating layer | Absorbance of emulsion layer | Line width A | Line width B |
|---|---|---|---|---|
| 19A | 0.55 | 0.20 | 20 μm | 12 μm |
| 20B | 0.55 | 0.00 | 20 μm | 16 μm |
| 20B | 0.55 | 0.20 | 20 μm | 17 μm |
| 20C | 0.55 | 0.20 | 20 μm | 20 μm |

Example 21

(Formation of titanium dioxide layer from titanium oxide colloid liquid)

In the same manner as in the preparation of the sample 3C in Example 3, a titania sol (TA-15, supplied by Nissan Chemical Industries, Ltd.) was applied onto one surface of a soda lime glass substrate so as to form a 0.3 μm thick dry layer, and the thus-formed coating was dried at room temperature and then heated at 200° C. for 30 minutes.
(Formation of titanium dioxide layer from organotitanium compound)

A solution of isopropyl orthotitanate in methyl ethyl ketone was applied onto one surface a soda lime glass substrate so as to form a 0.2 μm thick dry layer, and thus-formed coating was heated at 500° C. for 1 hour to form a titanium dioxide layer on the glass substrate. (Formation of titanium dioxide layer from titanium chelate liquid)

Eolido T-199B (titanium chelate liquid, content of 4% as titanium dioxide, supplied by Teikoku Kagaku Sangyo K.K.) was applied onto one surface of a soda lime glass substrate so as to form a 12 μm wet coating, and the coating was heated at 500° C. for 1 hour to form a titanium dioxide layer on the glass substrate.

Then, the same back containing layer as the back coating layer formed in Example 1 was formed on the other surface of each of the above glass substrates.

A palladium sulfide physical development center solution was prepared in a polyethylene glycol alkyl ether aqueous solution. The physical development center solution was applied onto the titanium dioxide layer of each of the above glass substrates such that the polyethylene glycol alkyl ether amount was 0.1 g/m² and that the palladium sulfide center amount was 1 mg/m², and the thus-formed coatings were dried.

The same silver halide emulsion as that prepared in Example 1 was applied onto the physical development center layer of each of the above glass substrates such that the application amount of the silver halide was 8 g/m², and the thus-formed coatings were dried, to obtain photomask material samples (21A) to (21C) having the titanium dioxide layer formed from a titanium oxide colloid solution, an organotitanium compound or a titanium chleate liquid. Further, a sample (21D) having no such titanium dioxide layer was also prepared.

The above samples (21A) to (21D) were imagewise exposed to light with a contact printer (P-615-D, supplied by Dainippon Screen Seizo K.K.) and then immersed in the same diffusion-transferring developer solution (35° C.) as that used in Example 1 for 1 minute, and the silver halide emulsion layers were washed off with warm water (35° C.), followed by washing with water and drying. The obtained samples were horizontally placed, a piece of gauze was placed on each image, and the gauze was reciprocally moved in the horizontal direction in a state in which a load of 100 g was exerted. In this manner, each sample was visually studied for an image strength by visually observing the image for a peeling. No peeling was observed in the samples (21A) to (21C), while image peeling was found in the sample (21D).

Example 22

A sample (22A) was prepared in the same manner as in the preparation of the sample (21C) except that the surface of the titanium oxide layer was irradiated with ultraviolet light from a 120 ultra-high pressure mercury lamp after the heating but before the formation of the physical development center layer in the process of preparing the sample (21C).

The sample (22A) was exposed to light and processed in the same manner as in Example 21, and the sample was studied for an image strength to show no peeling like the sample (21C). When the images of the the samples (21C) and (22A) were observed through a 100-powered magnifier, fine pinholes having a diameter of 20 μm or smaller were found in the sample (21C). In the sample (21C), the image was not firmly fixed in very fine areas, and some areas of the image therefore peeled off and caused the pinholes. In the image sample (22A), such pinholes were not found.

Example 23
(Preparation of photomask sample)

A titania sol (TA-15, supplied by Nissan Chemical Industries, Ltd.) was applied onto one surface of a soda lime glass substrate so as to form a 0.3 μm thick layer, and the thus-formed coating was dried at room temperature and then heated at 200° C. for 30 minutes. A palladium sulfide physical development center solution was prepared in a polyethylene glycol alkyl ether aqueous solution and applied onto the titania-sol-coated surface of the soda lime glass substrate such that the palladium sulfide center amount was 1.0 mg/m², and thus-formed coating was dried. A silver halide emulsion was prepared by the following method. An alkali-treated gelatin was provided, and by a control double jet method, there was prepared a silver bromoiodochloride which contained 15 mol % of silver bromide and 0.4 mol % of silver iodide, was doped with 0.006 mmol, per mole of the silver, of potassium hexachloroiridiate and had an average particle diameter of 0.25 μm. Then, the emulsion was desalted by a flocculation method. Further, the emulsion was sensitized with sulfur+gold, and was spectrally sensitized by adding 3 mg, per gram of the silver halide, of the sensitizing dye (a 3). Further, to the emulsion was added $10^{-3}$ mol, per mole of the silver halide, of 1-phenyl-5-mercaptotetrazole. The thus-prepared silver halide emulsion was finally adjusted such that the gelatin content per gram of the silver halide was 2.0 g. The silver halide emulsion was applied onto the physical development center layer of the glass substrate, and the thus-formed coating was dried to obtain a photomask material sample.

The above photomask material sample was imagewise exposed to light while an image was attached thereto, and then, the photomask material sample was immersed in a diffusion-transferring developer solution to be described later, for 1 minutes. Then, the photomask material sample was immersed in one of the fixing solutions (23A) to (23H) for 1 minute, and then the fixing solution was forcibly stirred to remove the silver halide emulsion. The photomask material sample was washed with tap water, finally washed with pure water and dried, to give a photomask. The surface of the photomask was observed, and the photomask was evaluated on the basis of the following criteria with regard to the presence or absence of a residual silver halide emulsion on the surface. Table 21 shows the results.

A: No residual emulsion
B: Residual emulsion found

It has been found that the use of the fixing solution of the present invention can completely remove the silver halide emulsion. For practical use as a method of processing a photomask material, there is required a processing method in which a high-performance photomask can be stably obtained for a short period of time. While the silver halide emulsion can be removed by simple rubbing in warm water for a long period of time, it is desired for practical use that the silver halide emulsion can be removed by simple processing for a short period of time as described above.

Further, the photomask was left in an environment having a temperature of 35° C. and a relative humidity of 80% for 1 week to study a change in the image, and the photomask was evaluated on the basis of the following criteria.

A: No change
B: Change in gloss

| Diffusion-transferring developer solution (1,000 ml) | |
| --- | --- |
| Sodium hydroxide | 20 g |
| Hydroquinone | 20 g |
| 1-Phenyl-3-pyrozolidinone | 2 g |
| Anhydrous sodium sulfite | 80 g |
| Anhydrous sodium thiosulfate | 6 g |
| Monomethylethanolamine | 6 g |
| Deionized water | balance |
| pH = 13.3 | |

TABLE 21

| Fixing solution | 23A | 23B | 23C | 23D | 23E | 23F | 23G | 23H |
| --- | --- | --- | --- | --- | --- | --- | --- | --- |
| Bioplase 30L | 1 g | 1 g | 1 g | 1 g | 1 g | No | 1 g | 1 g |
| Monosodium phosphate | 30 g | 30 g | 30 g | 30 g | 30 g | No | No | 30 g |
| Sodium sulfite | 10 g | 10 g | 10 g | 10 g | 10 g | 10 g | 10 g | 10 g |
| pH, adjusted with sulfuric acid | 4.0 | 5.0 | 6.0 | 6.0 | 6.0 | 6.0 | 6.0 | 8.0 |
| Volume, adjusted with water | 1 L | 1 L | 1 L | 1 L | 1 L | 1 L | 1 L | 1 L |
| Temperature (° C.) | 30 | 30 | 20 | 30 | 40 | 30 | 30 | 40 |
| Residual emulsion on surface | B | A | B | A | A | B | B | A |
| Change in image after storage | A | A | A | A | A | A | A | B |

In Table, Bioplase 30L represents Bioplase 30L (one type of bacterium proteinase) supplied by Nagase Sangyo K.K.

Example 24

Four processing vessels having a length of 742 mm, a width of 50 mm and a height of 593 mm were prepared. The first vessel was used as a development vessel, and the same developer solution as that used in Example 23 was placed therein and maintained at a temperature of 35° C. The second vessel was used as a fixing vessel, and the same fixing solution as that (23E) used in Example 23 was placed therein. The third vessel was used as a washing vessel, and tap water was placed therein. The fourth vessel was used as a washing vessel, and pure water was placed therein. An image was attached to the photosensitive material having a size of 508 mm×610 mm×5 mm, prepared in Example 23, and the photosensitive material contacted to the original and image was exposed. The photosensitive material was fixed so as to allow the exposed surface to stand in the vertical direction, and immersed in the developer solution in the first vessel by lowering it in the vertical direction. The photosensitive material was elevated after 1 minute, and then immersed in the fixing solution in the second vessel. While the photosensitive material was lifted up after 1 minute, fixing solution in the vessel was carried up with a magnetic pump to blow it onto both the surfaces thereof through shower nozzles. Then, the photosensitive material was immersed in the water in the third vessel, and while it was lifted up after 1 minute, water in the vessel was blown onto the surfaces like the case in the second vessel. Then, the photosensitive material was immersed in the water in the forth vessel, lifted up after 30 seconds, and dried with an air knife, to give a photomask sample (24A).

Similarly, the same photosensitive material as the above material obtained by contacting an image and exposing it to light was immersed in the developer solution in the first vessel, elevated after 1 minute and immersed in the fixing solution in the second vessel. After 1 minute, while the photosensitive material was elevated up and down once every 10 seconds, fixing solution was carried up with a magnet pump to blow it onto both the surfaces of the photosensitive material through shower nozzles. After 1 minute (the above procedure was repeated six times), the photosensitive material was lifted up and immersed in the water in the third vessel, and after 1 minute, while the photosensitive material was elevated up and down, water in the vessel was carried up to blow it like the case in the second vessel. Then, the photosensitive material was immersed in the water in the fourth vessel, lifted up after 30 seconds, and dried with an air knife, to give a photomask sample (24B).

The surfaces of the photomask samples (24A) and (24B) were observed to evaluate the presence or absence of a residual silver halide emulsion on the surfaces. No residue was found in any of these photomask samples. Further, the water in the third vessels in the processing for the above photomasks (24A) and (24B) and water in the third vessel when the blowing of fixing solution in the second vessel and water in the third vessel was not carried out (24C) were compared. While the water in the third vessel in the case of (24C) was found to be turbid, the water in the vessel for the photomasks (24A) and (24B) were found to be free from being turbid.

Example 25

A photomask sample (25A) was prepared in the same manner as in the preparation of the photomask sample (24B) in the Example 24 except that monomethylethanolamine was not added to the developer solution. When the photomask sample (24B) was observed, thin streaks caused by the showering were found although no detrimental effect was caused, and the streaks were analyzed to show that they were formed of a very small amount of silver. On the photomask sample (25A), the thin streaks caused by the showering were not found.

What is claimed is:

1. A photomask material having at least a silver halide emulsion layer and a physical development center layer on a glass substrate, the physical development center layer being formed between the glass substrate and the silver halide emulsion layer, the photomask material being for giving a metal silver image having a thickness of 1 μm or less formed on the glass substrate by physical development, the metal silver image having a maximum optical density of 1.0 or more.

2. The photomask material of claim 1, wherein the metal silver image has a thickness of 0.5 μmm or less.

3. The photomask material of claim 1, which is substantially free from a residual water-soluble gelatin in the metal silver image and a non-image area.

4. The photomask material of claim 1, wherein silver halide emulsion layer contains at least $1 \times 10^{-2}$ mol/m$^2$ of silver halide particles, and the silver halide emulsion layer has a thickness, measured from the glass substrate, of 2 μm or less per $1 \times 10^{-2}$ mol/M$^2$ of the silver halide particles.

5. The photomask material of claim 1, wherein silver halide emulsion layer contains at least $1 \times 10^{-2}$ mol/m$^2$ of silver halide particles, and the silver halide emulsion layer has a thickness, measured from the glass substrate, of 1 μm or less per $1 \times 10^{-2}$ mol/m$^2$ of the silver halide particles.

6. The photomask material of claim 1, wherein the silver halide emulsion layer, a layer below the silver halide emulsion layer or both of these layers contain a low-molecular-weight gelatin having a molecular weight of 50,000 or less.

7. The photomask material of claim 1, wherein the physical development center is distributed in a range of 0.1 μm in a thickness direction.

8. The photomask material of claim 1, wherein the silver halide emulsion contains silver bromide in an amount of 3 mol % to 40 mol %.

9. The photomask material of claim 1, wherein the silver halide emulsion contains silver iodide in an amount of 0.1 mol % to 1 mol %.

10. The photomask material of claim 9, wherein at least 90% of the contained silver iodide is present in a region which represents 5% or less in terms of a molecular weight from the surface of a silver halide particle.

11. The photomask material of claim 10, wherein at least 90% of the contained silver iodide is present in a region which represents 1% or less in terms of a molecular weight from the surface of a silver halide particle.

12. The photomask material of claim 1, which has a hydrophilic colloid layer on a surface of the glass substrate which surface is opposite to a surface where the silver halide emulsion layer is formed, the hydrophilic colloid layer containing a dye, a pigment or both of these, the hydrophilic colloid layer having an absorbance of at least 0.30 at a maximum wavelength of (a light emission intensity of a light source)×(a spectral sensitivity of the silver halide emulsion).

13. The photomask material of claim 12, wherein the silver halide emulsion layer contains a dye, a pigment or both of these, and the dye, the pigment of both of these have an absorbance of 0.01 to 0.30 at a maximum wavelength of (a light emission intensity of a light source)×(a spectral sensitivity of the silver halide emulsion).

14. The photomask material of claim 1, which is for use to form an image by irradiation with a laser or a light emitting diode having a beam diameter of 30 μm or less.

15. The photomask material of claim 1, wherein the silver halide emulsion is a product prepared in the presence of a water-soluble iridium salt, a water-soluble rhodium salt or both of these.

16. The photomask material of claim 1, wherein a layer made of a metal oxide is interposed between the glass substrate and the physical development center layer.

17. The photomask material of claim 16, wherein a layer made of titanium dioxide as a main component is interposed between the glass substrate and the physical development center layer.

18. The photomask material of claim 17, wherein the layer made of titanium dioxide as a main component is a product formed by applying a solution containing a titanium dioxide colloid and heating a thus-formed coating.

19. The photomask material of claim 17, wherein the layer made of titanium dioxide as a main component is a product formed by applying an organotitanium compound and heating a thus-formed coating.

20. The photomask material of claim 17, wherein the layer made of titanium dioxide as a main component is a product formed by applying a titanium chelate liquid and heating a thus-formed coating.

21. The photomask material of claim 17, wherein the layer made of titanium dioxide as a main component is a product which is irradiated with ultraviolet light after heated but before the physical development center layer is formed.

22. A method of processing the photomask material recited in claim 1, which comprises the processing steps at least of development, fixing with a fixing solution and washing with water, the fixing solution containing a proteolytic enzyme and a phosphoric acid salt, having a pH of at least 5 and being maintained at a constant temperature of at least 30° C., the silver halide emulsion being removed with the fixing solution in the fixing step.

23. The method of claim 22, wherein the method includes at least one step of processing with a processing liquid having a pH of 7 or less after the development step.

24. The method of claim 22, wherein, during the removal of the silver halide emulsion in the fixing step, a fixing liquid flow is blown at least to a silver halide emulsion surface of the photomask material when the photomask material is lifted up after immersed in the fixing solution in a fixing vessel.

25. The method of claim 22, wherein, during the removal of the silver halide emulsion in the fixing step, a fixing liquid flow is blown at least to a silver halide emulsion surface of the photomask material while the photomask material is reciprocally moved up out of a fixing vessel and down into the fixing vessel after immersed in the fixing solution in the fixing vessel.

26. The method of claim 24 or claim 25, wherein the removal of the silver halide emulsion in the fixing step substantially does not include any step of physically rubbing the silver halide emulsion surface of the photomask material.

27. The method of claim 22, wherein a developer solution substantially does not contain any amine compound as a solvent to dissolve the silver halide.

28. A photomask which is prepared from the photomask material recited in claim 1 and has a pattern formed.

* * * * *

UNITED STATES PATENT AND TRADEMARK OFFICE
CERTIFICATE OF CORRECTION

| | |
|---|---|
| PATENT NO. | : 6,312,857 B1 |
| DATED | : November 6, 2001 |
| INVENTOR(S) | : Nakagawa et al. |

It is certified that error appears in the above-identified patent and that said Letters Patent is hereby corrected as shown below:

<u>Title page,</u>
Item [30], Foreign Priority Data, delete April 17, 1999 and insert -- April 27, 1999 --

Signed and Sealed this

Twenty-third Day of April, 2002

Attest:

JAMES E. ROGAN
*Attesting Officer*   *Director of the United States Patent and Trademark Office*